United States Patent
Inoue et al.

(10) Patent No.: US 9,250,535 B2
(45) Date of Patent: Feb. 2, 2016

(54) SOURCE, TARGET AND MASK OPTIMIZATION BY INCORPORATING COUNTOUR BASED ASSESSMENTS AND INTEGRATION OVER PROCESS VARIATIONS

(71) Applicant: INTERNATIONAL BUSINESS MACHINES CORPORATION, Armonk, NY (US)

(72) Inventors: Tadanobu Inoue, Kanagawa (JP); David O. Melville, New York, NY (US); Alan E. Rosenbluth, Yorktown Heights, NY (US); Masaharu Sakamoto, Kanagawa (JP); Kehan Tian, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 382 days.

(21) Appl. No.: 13/837,435

(22) Filed: Mar. 15, 2013

(65) Prior Publication Data

US 2014/0268075 A1    Sep. 18, 2014

(51) Int. Cl.
    G03B 27/68    (2006.01)
    G03B 27/32    (2006.01)
    G03F 7/20     (2006.01)

(52) U.S. Cl.
    CPC ............ G03F 7/70125 (2013.01); G03F 7/705 (2013.01); G03F 7/70308 (2013.01); G03F 7/70441 (2013.01)

(58) Field of Classification Search
    CPC .......................... G03F 7/70441; G03F 7/70308
    USPC .................. 355/52, 53, 55, 77; 716/19, 21
    See application file for complete search history.

(56) References Cited

U.S. PATENT DOCUMENTS

| | | | |
|---|---|---|---|
| 6,361,903 B1 | 3/2002 | Fujimoto | |
| 6,548,214 B2 | 4/2003 | Yoshizawa et al. | |
| 7,269,817 B2 | 9/2007 | Heng et al. | |
| 7,607,114 B2 | 10/2009 | Mansfield et al. | |
| 7,617,477 B2 * | 11/2009 | Ye et al. | 716/56 |

(Continued)

FOREIGN PATENT DOCUMENTS

| | | |
|---|---|---|
| JP | 07-066178 | 3/1995 |
| JP | 3508306 | 3/2004 |

OTHER PUBLICATIONS

Yunfei, D., et al. "Lithography Target Optimization With Source-Mask Optimization" Proceedings of the SPIE Optical Microlithography XXV Conference, vol. 8326. Feb. 2012. (8 pages).

Primary Examiner — Hung Henry Nguyen
(74) Attorney, Agent, or Firm — Tutunjian & Bitetto, P.C.; Vazken Alexanian

(57) ABSTRACT

Methods and systems for determining a source shape, a mask shape and a target shape for a lithography process are disclosed. One such method includes receiving source, mask and target constraints and formulating an optimization problem that is based on the source, mask and target constraints and incorporates contour-based assessments for the target shape that are based on physical design quality of a circuit. Further, the optimization problem is solved by integrating over process condition variations to simultaneously determine the source shape, the mask shape and the target shape. In addition, the determined source shape and mask shape are output.

20 Claims, 6 Drawing Sheets

(56) References Cited

U.S. PATENT DOCUMENTS

| | | |
|---|---|---|
| 8,028,254 B2 | 9/2011 | Inoue et al. |
| 8,584,056 B2 * | 11/2013 | Chen et al. ................... 716/53 |
| 8,682,634 B2 | 3/2014 | Bagheri et al. |
| 8,880,382 B2 * | 11/2014 | Bagheri et al. ................ 703/6 |
| 2001/0049811 A1 | 12/2001 | Taoka |
| 2003/0106999 A1 | 6/2003 | Komuro et al. |
| 2004/0156030 A1 | 8/2004 | Hansen |
| 2010/0153902 A1 | 6/2010 | Inoue et al. |
| 2011/0230999 A1 | 9/2011 | Chen et al. |
| 2012/0113404 A1 * | 5/2012 | Hsu et al. ................... 355/67 |
| 2012/0133915 A1 * | 5/2012 | Matsuyama et al. .......... 355/67 |
| 2013/0185045 A1 | 7/2013 | Bagheri et al. |

\* cited by examiner

SOURCE, TARGET AND MASK OPTIMIZATION BY INCORPORATING COUNTOUR BASED ASSESSMENTS AND INTEGRATION OVER PROCESS VARIATIONS

BACKGROUND

1. Technical Field

The present invention relates to lithography processes, and, more particularly, to source, mask and target optimization for lithographic processes.

2. Description of the Related Art

Typical lithographic optimization methods, such as, for example, optical proximity correction (OPC), must work with pre-distilled target requirements. However, designing target shapes is relatively difficult in accordance with these methods, as the target shape needs to be re-designed iteratively and manually in a process referred to as retargeting.

In practice, the lithographic transfer process and the physics of the devices in the circuit both contribute in an integral way to overall successful functionality. However, in accordance with conventional methods, these two aspects are addressed separately via manual iterations between different engineering teams. Moreover, because the teams work in separate frameworks, neither team can easily design a substantial improvement in the overall process. For example, instead of maximizing yield, circuit designers are, at best, only able to provide the lithography team with shapes that satisfy simplified printability rules. As a result, lithography engineers are, at best, only able to identify small adjustments in target dimensions that are consistent with broad ground rules established by designers. These limitations arise even where yield of the most critical circuit structures are concerned, and the difficulty is compounded when the enormous volume of patterns present in a full layout is considered. OPC is inherently limited to simple considerations of edge placement error (EPE) only, thus, as a result, litho practice has typically segregated direct design considerations from automated mask data preparation.

SUMMARY

One embodiment is directed to a method for determining a source shape, a mask shape and a target shape for a lithography process. In accordance with the method, source, mask and target constraints are received. In addition, the method includes formulating an optimization problem that is based on the source, mask and target constraints and incorporates contour-based assessments for the target shape that are based on physical design quality of a circuit. Further, the optimization problem is solved by integrating over process condition variations to simultaneously determine the source shape, the mask shape and the target shape. In addition, the determined source shape and mask shape are output.

Another embodiment is also directed to a method for determining a source shape, a mask shape and a target shape for a lithography process. The method includes receiving source, mask and target constraints including tolerance band constraints for the target shape. Further, an optimization problem is formulated based on the source, mask and target constraints and is solved by maximizing a process window with the source, mask and target constraints to simultaneously determine the source shape, the mask shape and the target shape. In addition, the determined source shape and mask shape are output.

An alternative embodiment is directed to a system for determining a source shape, a mask shape and a target shape for a lithography process. The system includes an an objective formulation module and a solver. The objective formulation module is configured to receive source, mask and target constraints including tolerance band constraints for the target shape and to formulate an optimization problem based on the source, mask and target constraints. In turn, the solver is configured to solve the optimization problem by minimizing process variability bands with the source, mask and target constraints to simultaneously determine the source shape, the mask shape and the target shape, and is configured to output the determined source shape and mask shape.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
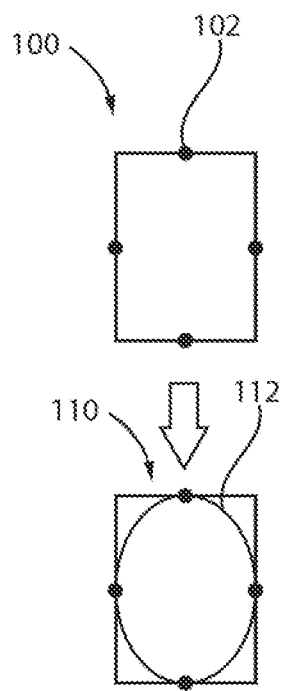
FIG. 1 is a high-level diagram illustrating exemplary evaluation points assessed for optimizing a target shape.

Lithographic processes generally involve receiving a fixed image target input that is to be transferred on a wafer. Source and mask optimization as well as wave-front engineering are performed to find the appropriate light source and mask shapes to implement the image transfer. Methods for target optimization can dispense with the rigid target positions of conventional OPC. However, they still evolve the lithographic solution under a highly idealized representation of design intent and process behavior. For example, in accordance with one such method, OPC's rigid positions for target edges are replaced by allowed bands or by allowed ranges of separation from other printed edges.

Referring now to the drawings in which like numerals represent the same or similar elements and initially to FIGS.

Figure 2:
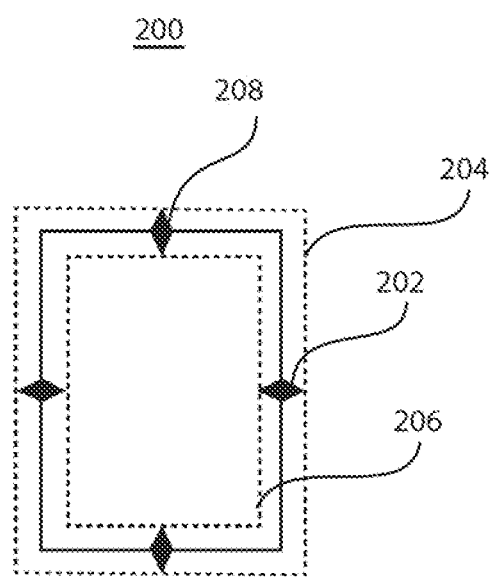
FIG. 2 is a high-level diagram illustrating an exemplary tolerance band employed to optimize a target shape.

1 and 2, a set of diagrams illustrating evaluation points and the concept of tolerance bands are provided. For example, diagram 100 illustrates evaluation points 102 for a target shape and diagram 105 illustrates a target shape 112 formed by the evaluation points 102. FIG. 2 provides a diagram 200 depicting the use of a tolerance band 202 which includes an outer limit 204 and an inner limit 206 that indicate the range in which the evaluation points 208 can be disposed for forming a target shape. Although this approach is an improvement to OPC, it still needs design iterations between circuit designers and lithography engineers.

Standard source-mask optimization (SMO) lithographic objectives may be replaced by parametric functions that are pre-fitted against massive electrical simulations, with lithographic requirements and allowable target bands being represented as constraints. This approach poses difficulties because a fitted model can only be expected to have a limited range of validity. While the method is sufficient for small refinements, it still entails a significant loss of flexibility and maneuverability.

These methods neglect the interactive impact on overall yield that the lithographic process and device behavior create in combination. For example, a proper accounting of different potential failure modes in a given clip or chip should take into account whether the potential failure modes tend to occur in the same process "corners," i.e. under the same combinations of fluctuations in process conditions like dose, focus, and mask bias, and also whether these failure modes tend to occur on a chip-to-chip basis, or as within-chip variations, or as wafer-to-wafer variations. In general, the loss of flexibility and maneuverability that these methods entail becomes a serious liability as integrated circuit manufacturing methods approach fundamental resolution limits.

Figure 3:
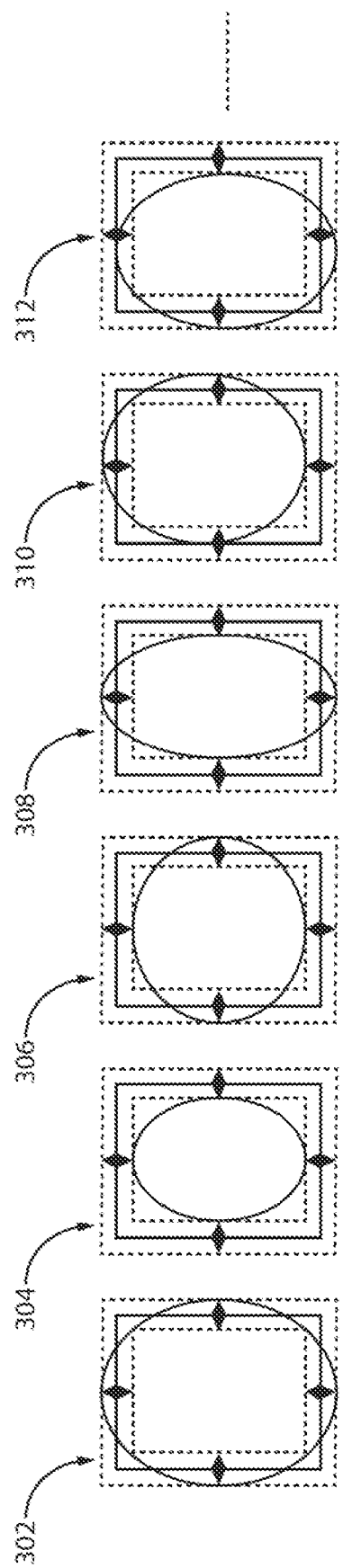
FIG. 3 is a high-level diagram illustrating possible variations of evaluation points for determining a target shape in accordance with exemplary embodiments of the present invention.

For example, one particular method prepares test patterns with various target sizes that range from zero to 200% of a baseline shape that can be assessed through retargeting. Each test pattern has multiple target polygons and the same retargeting biases are used for them within one test pattern uniformly. For example, with reference to FIG. 3, diagrams 302 and 304 represent a set of target pattern sizes that can be assessed in this method. Here, SMO is executed with test patterns for each target size and the process variation band of the test patterns for each of the target sizes is evaluated. Then, the best target size for each test pattern is selected and SMO is executed for the test patterns with their respective target sizes. Here, the final SMO result is obtained after the lithographic target optimization is obtained. However, selecting the target shape before SMO may result in employing a target shape that is not best suited to the final source and mask that is obtained.

In contrast to these methods, the exemplary embodiments of the present principles described herein optimize the source, target and mask shapes simultaneously, which can include constraints expressing tolerance bands or more general contour-based assessments, and constraints expressing process window constraints or more general process assessments. For example, as discussed in more detail herein below, the source-target-mask optimization (STMO) can be performed by solving a non-linear programming (NLP) problem. Here, in addition to source and mask variables and objectives, exemplary embodiments of the present principles also consider target objectives and variables. For example, target objectives considered can include maximizing the process window, minimizing the process variability band or maximizing a functionality modeling function, as discussed in further detail herein below. In addition, the constraints function can consider the tolerance band or a process variability band, or more general assessments of print contours and process variations. As a result, the constraints function can capture the interactive impact on overall yield that the lithographic process and device behavior create in combination, for example taking into account whether different potential failure modes tend to occur in the same process corners, and also whether these failure modes tend to occur on a chip-to-chip basis, or as within-chip variations, or as wafer-to-wafer variations. Thus, in contrast to employing uniform retargeting, as employed in diagrams 302 and 304 in FIG. 3, embodiments of the present principles described herein can find the best combination of source, target and mask shapes by considering a wider variety of target shapes that are varied at each of the evaluation points, as illustrated in diagrams 306, 308, and 310. In particular, in each of the methods described herein below, a location of each of the evaluation points 102 can be varied independently from a location of one or more of the other evaluation points to evaluate different target shapes for source, target and mask optimization. In addition, each target polygon in one test pattern can be varied respectively.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

A design for an integrated circuit chip determined in accordance with the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 4:
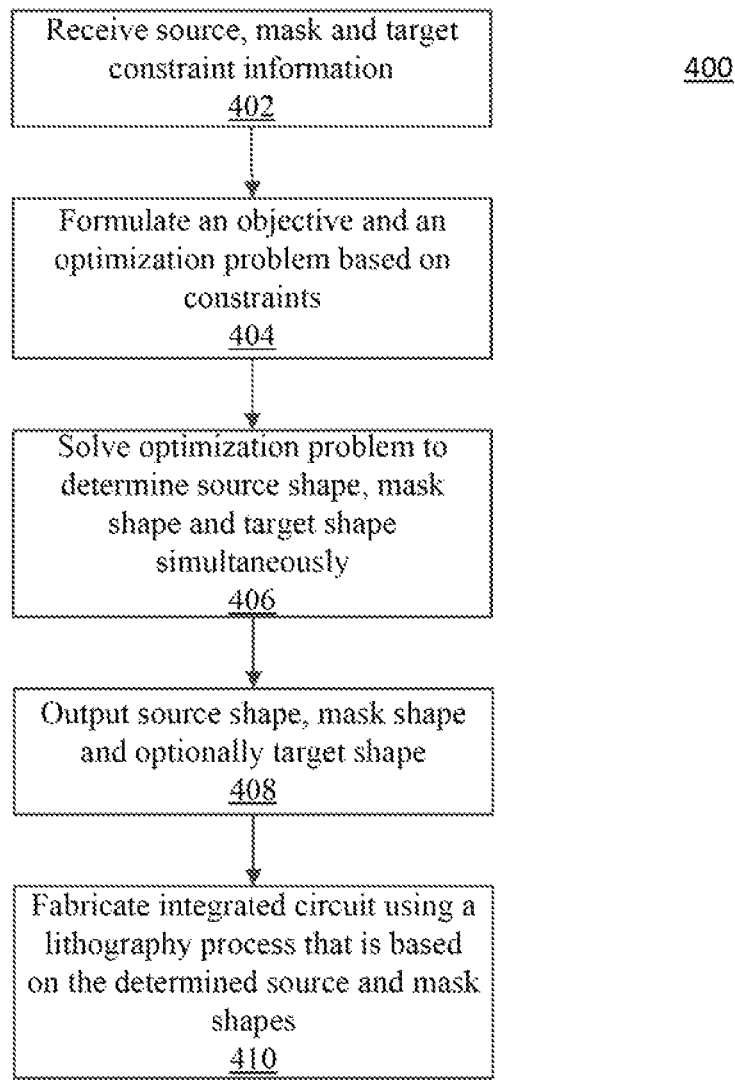
FIG. 4 is a high-level flow diagram of an exemplary method for determining a source shape, a mask shape and a target shape for a lithography process in accordance with an embodiment of the present invention.
Figure 5:
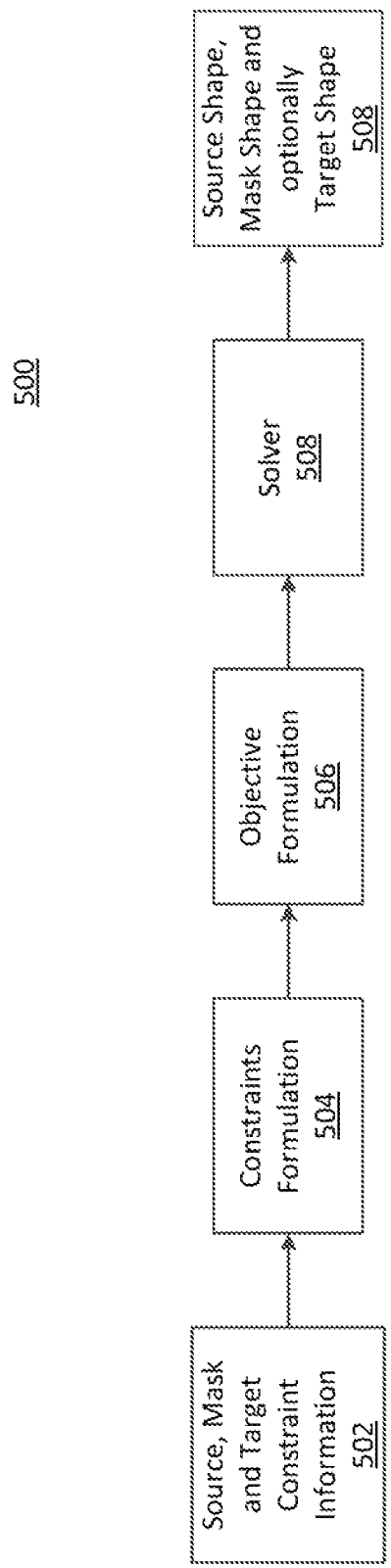
FIG. 5 is a high-level block/flow diagram of an exemplary system for determining a source shape, a mask shape and a target shape for a lithography process in accordance with an embodiment of the present invention.

With reference now to FIG. 4, a method 400 for optimizing source, target and mask shapes for a lithographic process in accordance with various exemplary embodiments of the present principles are illustratively depicted. In addition, an exemplary system 500 that can implement the method 400 is illustratively depicted in FIG. 5.

The method 400 can begin at step 402, at which source, mask and target constraint information 502 is received. At step 404, the objective formulation module 506 can formulate an objective and an optimization problem based on constraints formulized by the constraint formulation module 504, which uses the information received at step 402 to form a constraint function.

For example, the NLP optimization problem can be formulated as follows:

$$\min_{x \in R^n} f(x) \quad \text{or} \quad \max_{x \in R^n} f(x)$$

$$\text{s.t.} \quad g_i^L \leq g_i(x) \leq g_i^U$$

$$x_j^L \leq x_j \leq x_j^U$$

where f(x) denotes the objective function, which can be based on the process window, the process variability band or a functionality modeling function; $g_i(x)$ denotes the constraints function, which can be based on a tolerance band or a process variability band to account for acceptable target variations for the physical electrical circuit design, as well as other constraints employed in conventional SMO, such as manufacturability constraints, contrast constraints, constraints on dimension error, mask error enhancement factor (MEEF) constraints, etc.; and x denotes the source and mask variables, such as pixel intensities for the light source and polygon edge position for the mask.

At step 406, the solver 508 can solve the NLP optimization problem formulated at step 404 to obtain a source shape and a mask shape that can obtain the minimum or maximum objective value, depending on the formulation of the optimization problem. The final target shape is inherently conveyed by the source and mask shapes. The target shape can be Manhattanized into horizontal and vertical lines, in order to handle them easily in later processes. At step 408, the source and mask shapes determined at step 406 can be output, along with the corresponding target shape. Here, the steps 402-408 can be repeated for a plurality of different features to be formed in an integrated circuit. At step 410, an integrated circuit can be fabricated using a lithography process employing the source and mask shapes determined at step 406.

The method 400 and the system 500 can be implemented in accordance with various exemplary embodiments described herein below. Each of the embodiments considers goals and trade-offs between lithographic processes and the process of designing physical electrical circuits to maximize yield. Each of the embodiments can optimize the source, target and mask shapes simultaneously by incorporating contour-based assessments and the integration over process variations. The contour-based assessments evaluate quality for a physical design of electrical circuits by using tolerance bands or a process variability band, in addition to post-lithography quality. The contour-based assessments are employed for multiple process conditions within the process control space. Further, the embodiments described herein provide different types of optimization paths for different types of yield models by using contour-based assessments to obtain optimized source, target and mask shapes.

These contour-based assessments can incorporate the results of functionality and pattern transfer models which take as inputs an image in a developed resist, and this developed image may be taken as equivalent in shape to the print contour. The functionality and pattern transfer models used for contour assessment may be based on simulation, experimental data, or a combination thereof. The assessments provided by the functionality and transfer models may comprise probabilities of successful yield, but the stochastic variables which drive these models should preferably not include lithographic fluctuations, since preferred embodiments of the invention account for lithographic variations using separate process fluctuation probabilities. In this way, the preferred embodiments can properly mirror the actual physical sequence of yield-impacting outcomes that take place during chip manufacture, in that the manufacturing sequence first involves a lithographic step which gives rise to print contours whose shape will be different under different fluctuations of the lithographic process conditions, and then the contours that are printed under the lithographic conditions actually arising get transferred with fixed shape into integrated circuit features in the particular IC level being fabricated. The preferred embodiments mirror this physical sequence by assessing the contours that are printed under each of a number of process conditions, which may comprise combinations of extreme process conditions that are referred to as process corners.

Separate process fluctuation probability functions may be adopted for within-chip and chip-to-chip variations, and separate contour assessment functions may be used in each case. For example, with lithographic process fluctuation components that operate on a within-chip basis, it may be appropriate for the objective to combine failure probability contributions from multiple different clips (assuming that multiple clips are being optimized together whose joint functionality is needed for successful chip yield), whereas with spatially extended fluctuations that operate on a chip-to-chip basis it may be that only the worst-case clip will contribute to overall chip yield. Here, clip refers to a small optimization field that may contain a critical pattern type or a circuit cell within the larger chip.

In accordance with one exemplary embodiment of the present principles, the process window (PW) is maximized for a floating target within tolerance bands (TB) using a non-linear solver, such as an interior point method optimizer, at step 406 to obtain source, target and mask shapes which provide the maximum objective value. Here, the process window calculation can be formulated with a nominal contour shift in order to support a floating target.

In accordance with an alternative embodiment, the PW is maximized for a floating target within TB using process variability bands (PVB) constraints by employing a non-linear solver at step 406 to obtain source, target and mask shapes which provide the maximum objective value. The PVB constraints are set at each evaluation point in the non-linear solver such that any contour position at a process condition is larger than the inner limit of the TB and less than the outer limit of the TB.

The NLP optimization problem can be formulated as follows:

$$\text{maxmize}\left\{\sum_f (w_{i,f}^- - w_{i,f}^+)\right\}$$

where, $$w_{i,f}^- \leq I_{i,f}^- - T + (I_{i,f}^- - I_{i,f}^+) \cdot \frac{B^-}{t}$$

$$w_{i,f}^+ \geq I_{i,f}^+ - T - (I_{i,f}^- - I_{i,f}^+) \cdot \frac{B^+}{t}$$

-continued $$w_{i,f}^- \leq \frac{I_{i,f}^- - I_{i,f}^+}{2}$$

$$w_{i,f}^+ \geq -\frac{I_{i,f}^- - I_{i,f}^+}{2}$$

$$w_{i,f}^- \geq w_{i,f+1}^-, w_{i,f}^+ \leq w_{i,f+1}^+, w_{i,f}^+ \leq w_{i,f}^-$$

Figure 6:
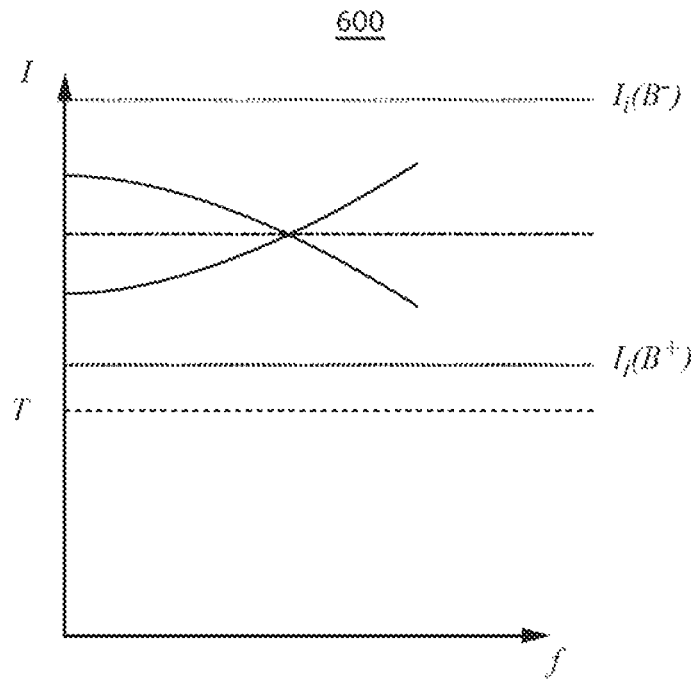
FIG. 6 is a graph illustrating a relationship between a source intensities and the focus of the source in accordance with a model employed by exemplary embodiments of the present invention.

Here, $w_{i,f}^-$ denotes the effective under exposure, $w_{i,f}^+$ denotes the effective over exposure. For example, where f is a focus plane, $w_i^-$ is an edge under intensity and $w_i^+$ is an edge over intensity. For example, an edge under intensity represents an intensity inside a closed contour of a target shape near the polygon edge, while an edge over intensity represents an intensity outside the closed contour of the target shape near the polygon edge. $I_{i,f}^-$ denotes the intensity at an evaluation point for under exposure, $I_{i,f}^+$, denotes the intensity at an evaluation point for over exposure, T denotes the resist threshold, $B^-$ denotes the distance to the inner line or limit of the tolerance band, $B^+$ denotes the distance to the outer line or limit of the tolerance band, and t denotes the distance between evaluation points for under and over exposure. Plot 600 of FIG. 6 illustrates the relationship between the source intensities and the focus of the source.

In accordance with an alternative exemplary embodiment, the PVB is minimized for a floating target within the TB in accordance with PVB constraints using a non-linear solver at step 406 to obtain source, target and mask shapes which provide the minimum objective value. The PVB objective is to minimize the width between maximum and minimum contour positions under sampling process conditions. The PVB band can be formulated as follows:

$$\text{Regular PVband} = \max\{EPE_i\} - \min\{EPE_i\}$$

where, $$EPE_i = EPE(f_i) + EPE(\Delta D_i) + EPE(\Delta L_i)$$

$$EPE(f) = \frac{I_i^e(f) - I_{anchor}}{e(f)}$$

$$I_i^e(f) = \frac{I_i^-(f) + I_i^+(f)}{2}$$

$$EPE(\Delta D) = \frac{\Delta D \cdot I_i^e(f)}{e(f)}$$

$$e(f) = \frac{I_i^-(f) - I_i^+(f)}{t}$$

$$EPE(\Delta L) = \Delta L \cdot m(f)$$

$$m(f) = \frac{\frac{dI_i^e(f)}{dL}}{e(f)}$$

$$\frac{dI_i^e(f)}{dL} = 2dA(f)d^{edge}$$

Here, $EPE_i$ denotes the edge placement error at a process condition, $EPE(f_i)$ denotes the edge placement error at a defocus condition, $EPE(\Delta D_i)$ denotes the edge placement error at an over/under light dose condition, $EPE(\Delta L_i)$ denotes the edge placement error at a mask error condition, $I_i^e(f)$ denotes the intensity at an evaluation point for an edge, $I_i^-(f)$ denotes the intensity at an evaluation point for under exposure, $I_i^+(f)$ denotes the intensity at an evaluation point for over exposure, $e(f)$ denotes an exposure latitude through focus and $m(f)$ denotes a MEEF through focus. EPE, as compared to its customary meaning, has been generalized to encompass a broader concept of relative printed edge position.

In accordance with an alternative embodiment, a functionality modeling function (FMF) is maximized for a floating target within the TB using PVB constraints by employing a non-linear solver at step 406 to obtain source, target and mask shapes which provide the maximum objective value. For example, the FMF for a floating target within the TB can be formulated based on the distances between contours and tolerance band borders. In particular, the NLP optimization problem can be formulated as follows:

$$\text{maximize}[\min(s(x_k))], \text{ where}$$

$$s(x_k) = 1 - a_i\left(\frac{x_k - x_i}{x_i - x_o}\right)^2 - a_o\left(\frac{x_k - x_o}{x_i - x_o}\right)^2$$

Figure 7:
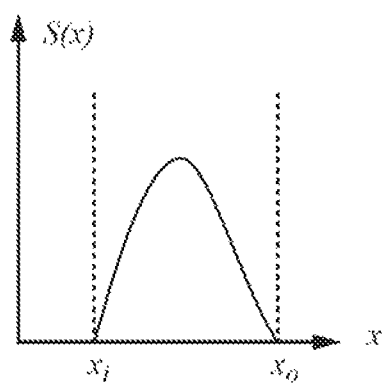
FIG. 7 is a graph illustrating a function on which an exemplary optimization is based in accordance with exemplary embodiments of the present invention.

Here, $[\min(s(x_k))]$ denotes a functionality modeling function, $x_k$ denotes a contour position k, $x_i$ denotes an inner tolerance band position at evaluation point k, $x_o$ denotes an outer tolerance band position at evaluation point k, and $a_o$ and $a_i$ denote coefficients. FIG. 7 illustrates a graph 700 of an exemplary implementation of $s(x_k)$.

In another embodiment, the FMF for a floating target within a TB can be formulated using a realistic process probability for light dose, source focus, and mask variations with contour-based yield assessments. In particular, the FMF can be formulated using a probability-based yield-window integral that maximizes per-contour yield S. For example, the NLP optimization problem can be formulated as follows:

$$\text{maximize} \sum_{\substack{Process \\ Conditions \\ f, \Delta D, \Delta L}} P(f)P(\Delta D)P(\Delta L)S(f, \Delta D, \Delta L)$$

where $$S(f, \Delta D, \Delta L) = \prod_k s(x_k) \Rightarrow \sum_k \log[s(x_k)] \text{ Independent fails}$$

$$\text{or} = \min_k[s(x_k)] \text{ Chip-to-chip variation}$$

Here, $$\sum_{\substack{Process \\ Conditions \\ f, \Delta D, \Delta L}} P(f)P(\Delta D)P(\Delta L)S(f, \Delta D, \Delta L)$$

denotes a functionality modeling function; $S(f, \Delta D, \Delta L)$ denotes a yield at a process condition of focus f, light dose variation $\Delta D$, and mask error $\Delta L$; and P(*) is the process probability, which is based on realistic data obtained from an actual optical system that is to implement the lithographic process, such as, for example, a stepper and elements from a mask house. The first equation for $S(f, \Delta D, \Delta L)$ provided denotes a yield contribution from failure mechanisms that are independent of one another, expressing the fact that successful overall yield is contingent on successful functionality at every potential pinch point $x_k$ along the print contour, whereas the alternative equation for $S(f, \Delta D, \Delta L)$ accounts for inter-chip or inter-clip yield variations, which can refer to all yield variations whose spatial scale is larger than the size of the optimization field being considered. The underlying stochastic variables which drive such spatially extended yield mechanisms will have a locally constant and uniform value during any physical processing of the print contours under any process corner, so successful yield during any physical instantiation of the print contours can only occur if the worst-case contour is assessed to print adequately, and, conversely, if the stochastic variables are such that the worst-case contour fails to yield, the prospects for successful yield at other contours no longer matters; thus the constraint is driven by the minimum (Min) yield along the print contour.

With this formulation the optimizer can exploit the interactive effects that arise between contour assessments and process variations. For example, other things being equal, high failure probability of many pinch points at only one process extreme is less serious than having at least one failure-prone pinch point at each of many process extremes, since additional failures do no further harm once a clip has failed at a given process corner. Since the objective is summed over multiple process conditions whose yield assessments take into account failure mechanisms that may vary on a clip-to-clip and chip-to-chip scale (and are therefore uniform over the optimization field), the optimizer is able to make tradeoffs that maximize overall yield probability across all process conditions by sacrificing performance at multiple contours as needed as long as these contours arise within process corners where irredeemable contours have already forced net failure.

In accordance with an alternative embodiment, the FMF can be configured as a weighted summation of the PV band and the distance between contours and tolerance band borders as follows:

$$f(x_k; x_i, x_o) = \\ -w_{pvb} \cdot [\max(x_k) - \min(x_k)] + w_{dist} \cdot \min\left[1 - a_i \cdot \left(\frac{x_k - x_i}{x_i - x_o}\right)^2 - \left(\frac{x_k - x_o}{x_i - x_o}\right)^2\right]$$

where $f(x_k; x_i, x_o)$ is the FMF, $w_{pvb}$ is the weight of the process variability band and $w_{dist}$ is the weight of the distance between contours and tolerance band borders. The remaining variables and constants are described above.

In another embodiment, the FMF can be formulated as a printability of printing edges out of the tolerance bands:

$$p_{D,M,F}(x) = \int \frac{1}{\sqrt{2\pi\left(\frac{\sigma_d}{ILS(f)}\right)^2}} e^{-\frac{(x-x_0(f))^2}{2\left(\frac{\sigma_d}{ILS(f)}\right)^2}}$$

$$\frac{1}{\sqrt{2\pi(\sigma_m \cdot MEEF(f))^2}} e^{-\frac{(x-x_0(f))^2}{2(\sigma_m \cdot MEEF(f))^2}} \frac{1}{\sqrt{2\pi\sigma_f^2}} e^{-\frac{f^2}{2\sigma_f^2}} df$$

where, $$ILS(f) = \frac{\frac{dI(f)}{dx}}{I(f)}$$

$$MEEF(f) = \frac{2aA(f)a^{edge}}{\frac{dI(f)}{dx}}$$

$$x_0(f) = \frac{I(f) - I_{nom}}{\frac{dI(f)}{dx}}$$

$\sigma_d^2$, $\sigma_f^2$ and $\sigma_m^2$ denote variance of probability for dose, focus and mask error respectively.

Alternatively, the FMF can be formulated by maximizing the worst-case yield.

Figure 8:
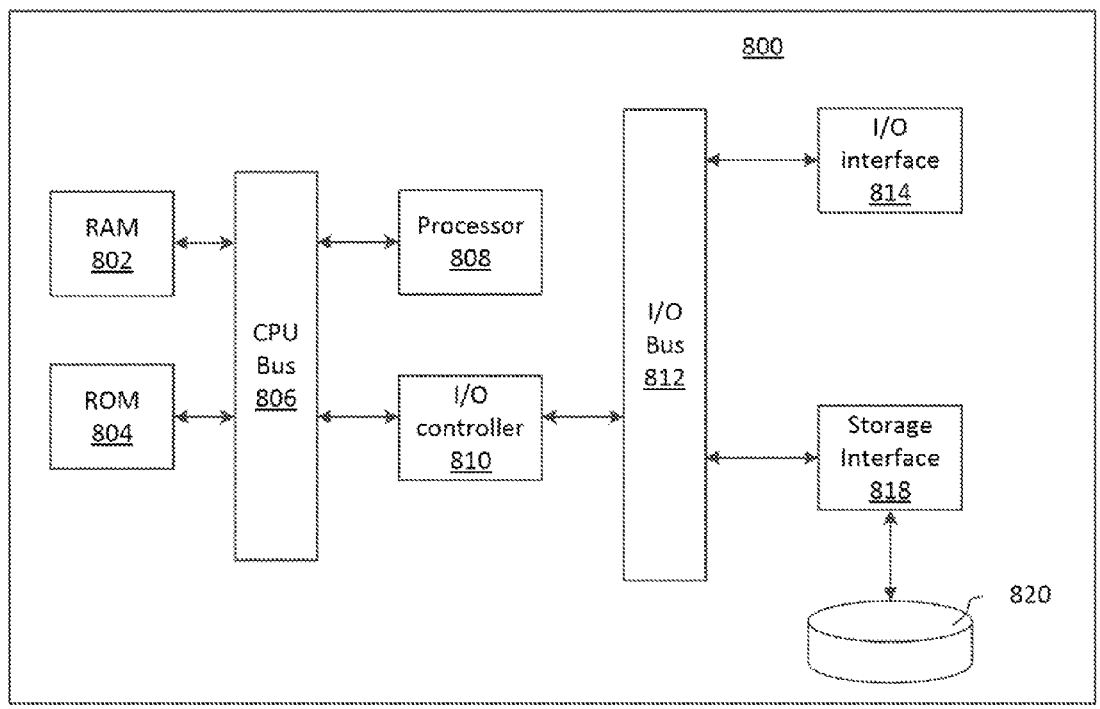
FIG. 8 is a high-level block diagram of a computing system by which exemplary method and system embodiments of the present invention can be implemented.

Other examples of the FMF include: transistor gate width, $W(x_{k,1}, x_{k,2})$; area coverage, $A(x_{k,1}, x_{k,2}, \ldots x_{k,n})$; Space, $S(x_{k,1}, x_{k,2})$; and Overlay $O(x_{k,1}, x_{k,2}, \ldots x_{k,n})$ Referring now to FIG. 8, an exemplary computing system 800 in which system embodiments of the present principles described above can be implemented, and by which method embodiments of the present principles described above can be implemented, is illustrated. The computing system 800 includes a hardware processor 808 that can access random access memory 802 and read only memory 804 through a central processing unit bus 806. In addition, the processor 808 can also access a storage medium 820 through an input/output controller 810, an input/output bus 812 and a storage interface 818, as illustrated in FIG. 8. The system 800 can also include an input/output interface 814, which can be coupled to a display device, keyboard, mouse, touch screen, external drives or storage mediums, etc., for the input and output of data to and from the system 800. For example, the source, mask and target constraints described above can be input into the system 800 through the interface 814 and the determined source shape, mask shape and/or target shape can be output from the system 800 through the interface 814. In accordance with one exemplary embodiment, the processor 808 can access software instructions stored in the storage medium 820 and can access memories 802 and 804 to run the software and thereby implement the method 400 described above. In addition, the processor 808 can implement each of the system elements described above, such as the constraints formulation module 504, the objective formulation module 506, and the solver 508. Alternatively, each of these system elements can be implemented via a plurality of processors 808.

It should be noted that the preferred embodiments discussed above account for interactions between contour and process that known methods essentially neglect. For example, the stochastic component of many failure mechanisms will only vary on macroscopic scales, meaning that, within each (microscopic) clip, all pinch points will succeed if the worst point succeeds, and no pinch point will fail unless the worst pinch point fails. However, chip success at a given process corner depends only on the failure probability for the worst pinch point (all clips). In addition, many failure mechanisms have a significant wafer-to-wafer component in their variability, meaning that, across all clips, no pinch points will fail unless the worst pinch point fails, & likewise for success. Further, some failure mechanisms are locally independent of one another, meaning that multiple pinch points within a chip can make independent contributions to the failure probability. For example, contours can pinch or bridge along diagonal axes, which per-fragment EPE assessment neglects. Moreover, high failure probability of many pinch points at only one process extreme is less serious than having at least one failure-prone pinch point at each of many process extremes, other things being equal. Once a clip has failed at a given process corner, additional failures do no further harm. In addition, moderate failure probability at each of many process extremes can be more serious than high failure probability at one process extreme. For example, a printed pattern where a contour is barely within the tolerance band at many different points can have a higher failure probability than a pattern where the contour slightly exceeds the limit, but only at one location. Further, a simple combinatorial exploration of process corners becomes expensive with multiple exposures. However, a yield model can use knowledge of distribution for each edge to approximate yield interaction of edges from different (independently exposed) masks, for example, by looking at joint Nσ combinations.

As discussed above, exemplary embodiments of the present principles optimize source, target, and mask shapes simultaneously by incorporating contour-based assessments and the integration over process variations. An important feature is the application of a model that encapsulates electrical and post-lithography quality assessment to the lithographic contours that are produced by the working solution under sampled conditions within the process control space. For example, these contour-based assessments are incorporated in the maximization of $[\min(s(x_k))]$ described above, as the maximization optimizes the distances between contour positions and tolerance band positions in a way that improves or maximizes the quality of the design of the physical electrical circuit to be produced through the lithography process. In addition, the contour-based assessments can further account for post-lithography quality. For example, as discussed above, the maximization of $$\sum_{\substack{Process \\ Conditions \\ f, \Delta D, \Delta L}} P(f) P(\Delta D) P(\Delta L) S(f, \Delta D, \Delta L)$$

can improve or maximize the post-lithography chip yield. Further, as indicated above, the integration of this functionality modeling function can use the contour-based assessments under multiple process conditions within the process control space. For example, as discussed above, the maximization of $$\sum_{\substack{Process \\ Conditions \\ f, \Delta D, \Delta L}} P(f) P(\Delta D) P(\Delta L) S(f, \Delta D, \Delta L)$$

can be performed over multiple process conditions, which can include focus, dose variation and mask error.

Further, a broad range of process and design specifications and goals/trade-offs can be represented by functionality modeling functions. The electronic circuit should print inside the pre-defined tolerance band, and different locations inside the band can have different "properties." Further, the lithographic objective can be defined using realistic process probability data for dose, focus, and mask variations. In addition, different types of integration paths for different types of yield models can be provided using generalized contour-based metrics, including as special cases: process window (PW) optimization with tolerance bands (TB), PW optimization with TB and process variability bands (PVB) constraints, PVB optimization with TB and PVB constraints, and functionality modeling function optimization with TB and PVB constraints. An advantage of the embodiments described herein is that source, target, and mask shapes can be obtained by maximizing user-intended types of yield automatically, eliminating time consuming, iterative communication between designers and lithography engineers. Thus, assessment of the functionality of the contours printed at a given process corner can be very efficient as compared to the calculation of the contours themselves, while giving the optimizer an awareness of interactions between contour and process variation which are neglected in known methods.

Having described preferred embodiments of methods and systems for source, target and mask optimization that incorporate contour based assessments and integration over process variations (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for determining a source shape, a mask shape and a target shape for a lithography process comprising:
   receiving source, mask and target constraints;
   formulating an optimization problem that is based on the source, mask and target constraints and incorporates contour-based assessments for the target shape that are based on physical design quality of a circuit, by forming a constraint function;
   solving, by a hardware processor, the optimization problem by integrating over process condition variations to simultaneously determine the source shape, the mask shape and the target shape; and
   outputting the determined source shape and mask shape.

2. The method of claim 1, wherein the integrating over the process condition variations employs the contour-based assessments under multiple process conditions within a process control space.

3. The method of claim 1, wherein said target constraints include at least one of tolerance band constraints or process variability band constraints for the target shape.

4. The method of claim 3, wherein said target constraints include tolerance band constraints and wherein said contour-based assessments are based on said tolerance band constraints and are further based on post-lithography quality.

5. The method of claim 3, wherein the solving comprises maximizing a functionality modeling function with said source, mask and target constraints.

6. The method of claim 5, wherein the functionality modeling function is based on distances between contours of the target shape and borders of tolerance bands.

7. The method of claim 6, wherein the maximizing comprises maximizing a per-target contour yield.

8. The method of claim 7, wherein the yield is a function of at least one of focus, light dose variation or mask error.

9. The method of claim 7, wherein the functionality modeling function is dependent on a process probability that is based on data measured from a physical optical system.

10. The method of claim 7, wherein the yield accounts for inter-chip variations.

11. The method of claim 5, wherein the solving comprises varying a location of at least one evaluation point of said target shape independently from a location of at least one other evaluation point of said target shape.

12. A method for determining a source shape, a mask shape and a target shape for a lithography process comprising:
   receiving source, mask and target constraints including tolerance band constraints for the target shape;

formulating an optimization problem based on the source, mask and target constraints by forming a constraint function;

solving, by a hardware processor, the optimization problem by maximizing a process window with said source, mask and target constraints to simultaneously determine the source shape, the mask shape and the target shape; and outputting the determined source shape and mask shape.

13. The method of claim 12, wherein said target constraints further comprise process variability band constraints for the target shape.

14. The method of claim 13, wherein said target constraints are set at each evaluation point of said target shape such that any contour position is within a corresponding tolerance band of said tolerance band constraints.

15. The method of claim 12, wherein the solving comprises varying a location of at least one evaluation point of said target shape independently from a location of at least one other evaluation point of said target shape.

16. A system for determining a source shape, a mask shape and a target shape for a lithography process comprising:

an objective formulation module configured to receive source, mask and target constraints including tolerance band constraints for the target shape and to formulate an optimization problem based on the source, mask and target constraints by forming a constraint function; and a solver, implemented by a hardware processor, configured to solve the optimization problem by minimizing process variability bands with said source, mask and target constraints to simultaneously determine the source shape, the mask shape and the target shape, and configured to output the determined source shape and mask shape.

17. The system of claim 16, wherein the optimization problem is dependent on an edge placement error that is based on at least one of a defocus condition, a light dose condition and a mask error condition.

18. The system of claim 16, wherein the solver is further configured to vary a location of at least one evaluation point of said target shape independently from a location of at least one other evaluation point of said target shape.

19. The system of claim 16, wherein said solver is a nonlinear solver.

20. The system of claim 16, wherein said solver is further configured to output said determined target shape.

* * * * *